United States Patent [19]

Zamborelli

[11] Patent Number: 5,172,051
[45] Date of Patent: Dec. 15, 1992

[54] WIDE BANDWIDTH PASSIVE PROBE

[75] Inventor: Thomas J. Zamborelli, Colorado Springs, Colo.

[73] Assignee: Hewlett-Packard Company, Palo Alto, Calif.

[21] Appl. No.: 690,752

[22] Filed: Apr. 24, 1991

[51] Int. Cl.⁵ .......................... G01R 31/02; G01R 1/06
[52] U.S. Cl. ...................................... 324/72.5; 324/149
[58] Field of Search ..................... 324/72.5, 72, 158 P, 324/149; 333/81 A

[56] References Cited

U.S. PATENT DOCUMENTS

| | | | |
|---|---|---|---|
| 2,881,400 | 4/1959 | Rogers | 324/149 |
| 2,883,619 | 4/1959 | Kobbe et al. | 324/149 |
| 3,015,080 | 12/1961 | Santlemann, Jr. et al. | 324/72.5 |
| 3,412,327 | 11/1968 | Murray | 324/72.5 |
| 4,051,432 | 9/1977 | Sarjeant | 324/72.5 |
| 4,418,314 | 11/1983 | Nieto, Jr. | 324/72.5 |
| 4,473,857 | 9/1984 | Winter | 324/72.5 |
| 4,743,839 | 5/1988 | Rush | 324/72.5 |
| 4,833,400 | 5/1989 | Boutigny | 324/72.5 |

OTHER PUBLICATIONS

Nanosecond Passive Voltage Probes McGovern Mar. 1977 IEEE Transactions.
High Voltage Probe System Sarjeant et al. Oct. 1976 Review of Scientific Instruments.

*Primary Examiner*—Jack B. Harvey
*Assistant Examiner*—Maura K. Regan

[57] ABSTRACT

A passive test probe apparatus 100 which provides high impedance and a relatively flat frequency response over a wide bandwidth. The probe apparatus 100 uses standard, non-lossy coaxial cable 130. The probe apparatus 100 employs a low capacitance probe tip 102 designed to minimize stray probe tip capacitance. The probe apparatus 100 uses a front-end (tip) resistor $R_t$ in series with a conventional RC tip network 240. The tip resistor $R_t$ provides two functions: First, it establishes a minimum input impedance for the probe input, and secondly, it provides approximately 80% of the high frequency attenuation when working into the cable characteristic impedance. In addition, a technique is described for determining an optimum length of coaxial cable 130 to be used in the probe apparatus 100. When the cable length is selected in accordance with the present invention, the crossover dip and other transmission line signal distortion effects are minimized.

23 Claims, 9 Drawing Sheets

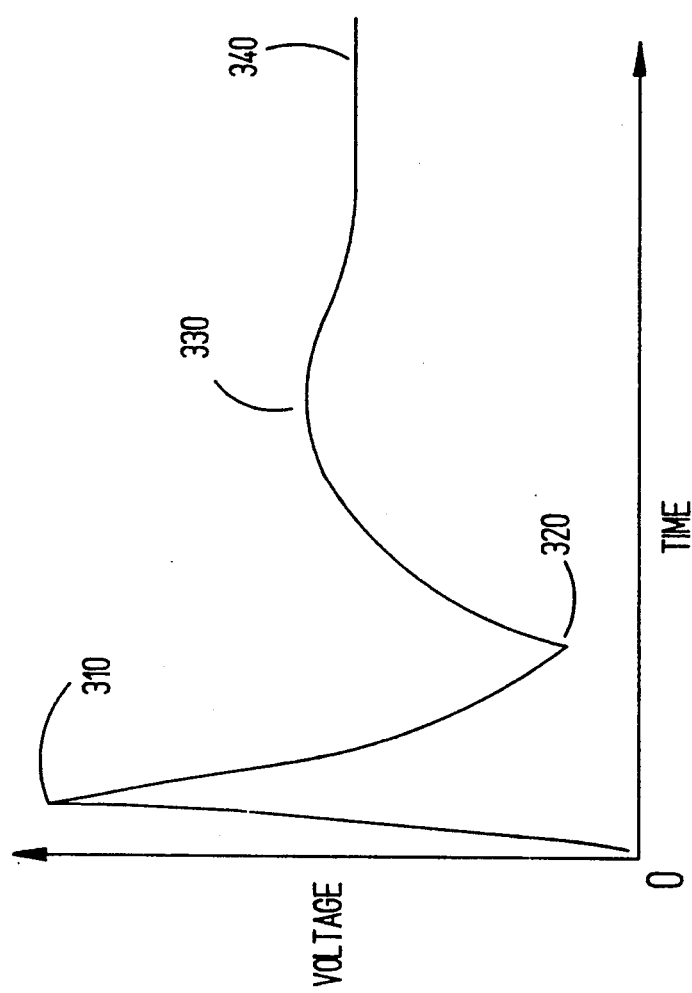

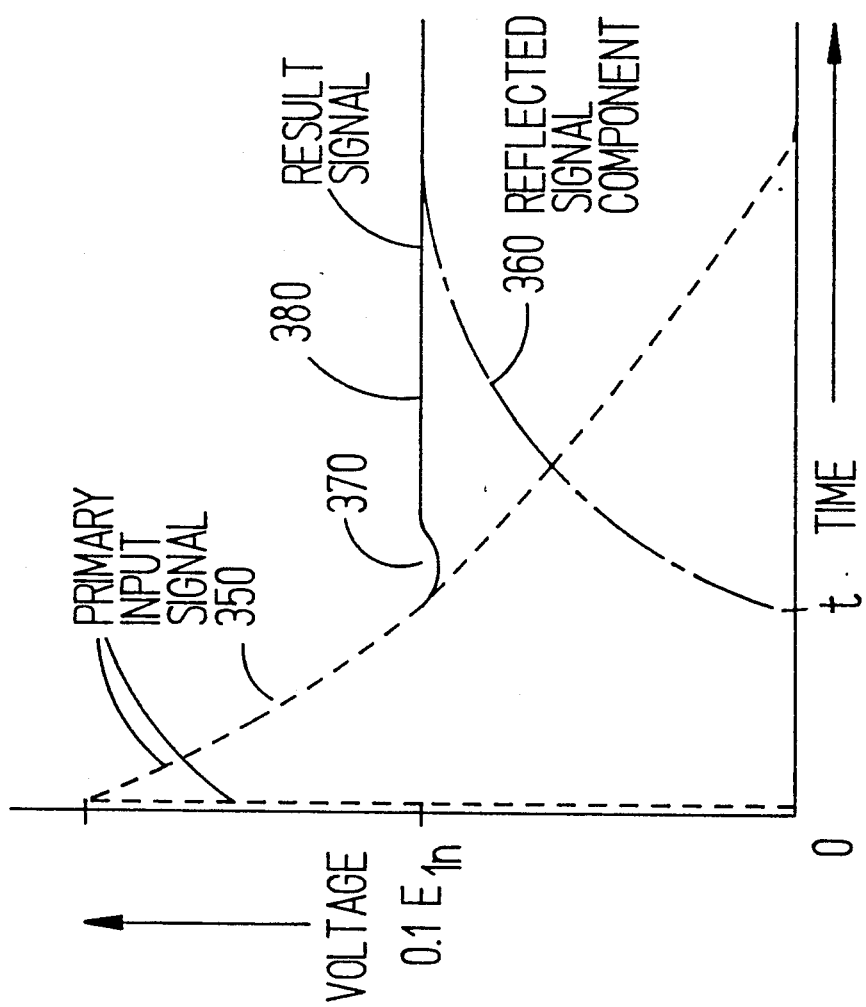

MID-BAND CIRCUIT

WIDE BANDWIDTH PASSIVE PROBE

BACKGROUND OF THE INVENTION

1. Field of the invention

This invention relates to electrical test probes, and more specifically, to a high impedance, wide bandwidth probe, for use with logic analyzers, oscilloscopes, and other electronic test instruments.

2. Statement of the Problem

Electrical test probes are used to transmit a signal voltage from a circuit under test to an electronic test instrument, such as a logic analyzer. There are two desirable electrical characteristics for test probes: First, the signal response at the test instrument should be an accurate (although attenuated) representation of the probed signal over the range of frequencies of interest. Second, the probe should not influence, or "load" the output from the circuit under test. In order to provide these characteristics, a probe should exhibit both high resistance and low capacitance. A high probe resistance allows relatively little of the output current to flow through the probe, thereby minimizing any loading effect of the probe on the circuit under test. The frequency response of a probe is dependent upon the capacitance of the probe in parallel with the resistance of the circuit under test. Capacitive reactance varies as a function of frequency, causing the impedance of the probe to fall as the applied frequency increases. The effective bandwidth of prior art probes has thus been limited by probe capacitance. Minimizing the probe tip capacitance has been seen as a solution to increasing the effective bandwidth of a probe. Compensating for probe capacitance has been attempted by using active electronics in the probe tip, but with the drawback of a bulky and easily damaged probe tip, which also requires additional components as well as a source of electrical power.

Passive probes are those which do not require electrical power for their operation. Prior art passive probes typically use either standard coaxial cable with a center conductor having low DC resistance, or "lossy line" coaxial cable having a significant distributed series resistance. A probe using lossy line cable is disclosed in U.S. Pat. No. 2,883,619, to Kobbe, et al. Most passive probes can be characterized as having three basic elements: a tip network, a section of cable, and a terminating network. These elements are connected in series and, when properly designed, provide a frequency compensated attenuator with a relatively flat response across a given frequency range. For both DC and low frequency AC signals, the frequency response of the probe is primarily a function of the tip and terminating networks (plus any DC resistance contributed by the cable). However, when the risetime of the input signal applied to the probe becomes a substantial fraction of the wavelength of the probe cable, the cable becomes a transmission line of substantial electrical length terminated at both ends with an impedance other than the characteristic impedance of the line. This mis-termination causes reflection of the input signal from the ends of the cable, resulting in unwanted distortion of the signal. The reflected signal not only results in a frequency response which is far from flat, but also causes a damped oscillation effect, called "ringing," when a square wave or a fast risetime signal is applied to the probe input. It would appear that a solution to the signal reflection problem would be termination of both ends of the cable with its characteristic impedance in order to absorb such reflected energy. The impedances required, however, are so low that they either unduly load the circuit under test or result in excessive attenuation. In addition, as shorter lengths of cable are used, signal energy reflected from the mis-terminated ends of the cable results in a phenomenon called "crossover dip." The input signal is reflected from the termination and travels back toward the signal input node, and is reflected back from the input node. Crossover dip results from the arrival, at the input node, of this reflected signal at a point in time after the original signal falltime amplitude has dipped below a desired value. The reflected signal then belatedly reinforces the falling amplitude signal, resulting in a non-flat signal response.

In addition to these problems, prior art probes exhibit certain undesirable characteristics specific to the apparatus used to implement the probe, when used over a wide frequency range. Two types of passive probes are representative of the prior art: a low impedance probe using standard (non-lossy) coaxial cable, and a relatively high impedance probe using lossy line coaxial cable.

The first type of prior art probe typically uses standard, low loss coaxial cable with a single resistor ("tip resistor") connected to the input end of the cable. A terminating resistor with a value equal to the characteristic impedance of the cable is connected to the cable output end. The input impedance of the probe is the sum of the tip resistor and the characteristic impedance of the cable, typically, 500 ohms for a probe with an attenuation factor of 10 ("10X probe") using 50 ohm coaxial cable. The characteristic impedance of the cable used is generally a maximum of 100 ohms, and therefore, a 10X probe using 100 ohm cable typically has only a 1K ohm input impedance. This type of probe maintains this input impedance at high frequencies; however, because this impedance is relatively low, the application of this probe is limited to probing low impedance circuits.

A second type of prior art probe utilizes lossy coaxial cable. Although this type of probe has a high impedance at DC, its effective bandwidth is limited due to the lossy nature of the cable and its high input capacitance. The bandwidth of a typical lossy cable probe is 200 megahertz (Mhz), with an upper limit of approximately 500 Mhz. A second limitation of this type of cable is low input impedance. The input capacitance, which is generally in the range of 6 picofarads (pF) to 10 pF provides only 31 ohms to 53 ohms of capacitive reactance in parallel with the high input resistance. The result is low input impedance at high frequencies. In addition, the lossy cable is relatively expensive as compared to standard coaxial cable.

The above problems with prior art probes are compounded by stray tip capacitance resulting from plate effect capacitance due to the capacitive interaction between the probe tip components and the grounded shield typically encompassing the tip network section of a typical probe. This stray capacitance further reduces the input impedance of the relatively low input resistance.

3. Solution to the Problem

The apparatus of the present invention solves the above problems by providing a passive, high impedance probe which has a relatively flat frequency response over a wide bandwidth. The present invention has several novel features, each of which provides an improvement over the prior art. One novel feature of the invention is a low capacitance probe tip designed to minimize stray probe tip capacitance. Another novel feature is the use of a front-end (tip) resistor in series with a conventional RC tip network. This front-end resistor provides two functions: First, it establishes a minimum input impedance for the probe input, and secondly, it provides approximately 80% of the high frequency attenuation when working into the cable characteristic impedance.

Yet another novel feature of the invention is the use of a standard, non-lossy coaxial cable. The use of standard coaxial cable is made possible because of the high frequency attenuation provided by the tip resistor, thus obviating the need for lossy cable. Any length of cable can be used, as long as the AC terminating capacitance is approximately twice the cable capacitance, and the cable length is properly selected. When the cable length is selected in accordance with the present invention, the crossover dip and related transmission line signal distortion effects are minimized. These signal distortion effects include "overshoot," which is the result of signal voltage increasing very rapidly to substantially the voltage applied to the input of the probe, which voltage is much higher than the desired attenuated voltage at the output end of the cable. The use of standard coaxial cable provides a significantly less expensive alternative to lossy cable.

In addition, the terminating network of the present invention contains two resistors in series with the terminating capacitor which add together to provide an impedance match with the cable. These resistors are split to provide the additional 20% of the high frequency attenuation when the signal output is taken from their common node.

BRIEF DESCRIPTION OF THE DRAWING

FIG. 3(a) is a graph showing substantial crossover dip as a result of non-optimal probe cable length;

FIG. 3(b) is a graph showing the time relationship between a primary input signal and a component of the input signal reflected from the termination and of probe cable having near-optimal length;

DETAILED DESCRIPTION OF THE INVENTION

Figure 1:
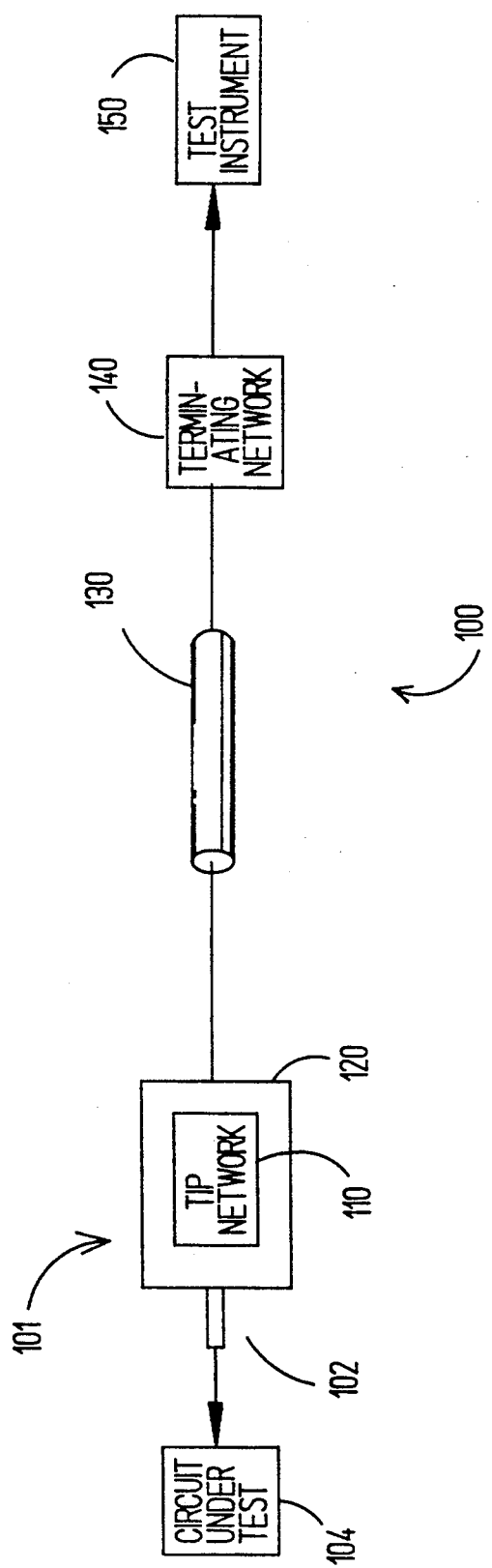
FIG. 1 is a block diagram of the probe apparatus according to the present invention, showing the relationship between a circuit under test, the probe tip assembly, a coaxial cable, the terminating network, and a test instrument.

FIG. 1 is a block diagram of one embodiment of the probe apparatus 100 of the present invention, showing the relationship between a circuit under test 104, the probe tip assembly 101, a coaxial cable 130, the terminating network 140 and a test instrument 150. In order to observe a signal in a circuit under test 104, the probe tip 102 of the test probe apparatus 100 is connected to an appropriate circuit contact point. The signal is then detected by the probe tip 102, transmitted through the probe apparatus 100, and output to an electronic test instrument 150, for example, a Hewlett-Packard logic analyzer model no. 16517. The probe apparatus 100 is comprised of a tip assembly 101, a coaxial cable 130, and a termination network 140. The tip assembly 101 contains a probe tip 102 and tip network 110. The input of the tip network 110 is connected to the probe tip 102, and the tip network 110 output is connected to one end of the coaxial cable 130. The other end of the coaxial cable 130 is connected to the input of the termination network 140, and the termination network 140 output is connected to the test instrument 150.

1. Probe Tip Architecture

Figure 2:
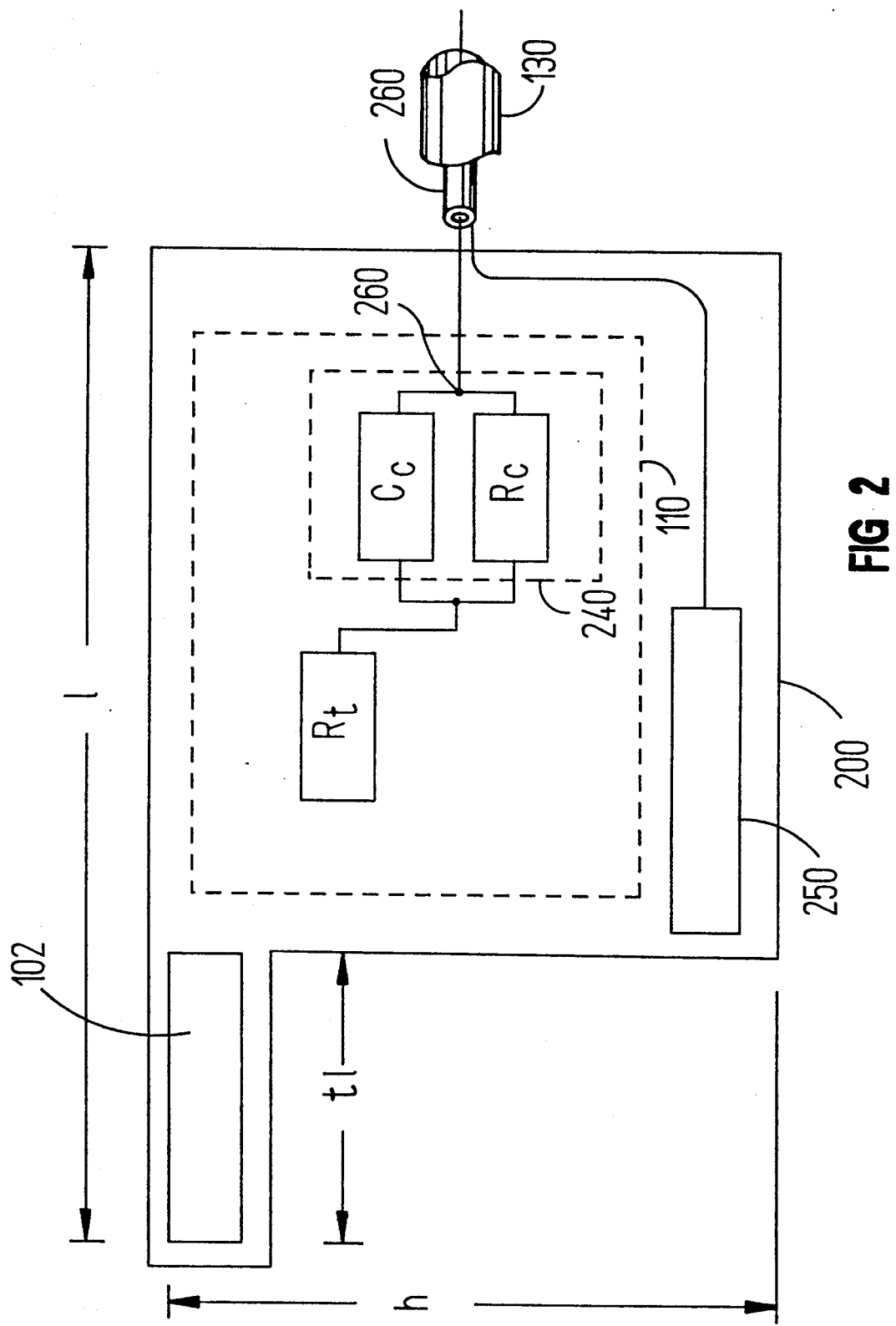
FIG. 2 is a diagram of the probe tip assembly.

FIG. 2 is a drawing (not to scale) of the probe tip assembly 101. The probe tip assembly 101 is comprised of a probe tip 102 and a tip network 110 contained inside of a non-conductive probe tip assembly housing 200. The approximate dimensions of the tip assembly 101 are: overall length $l=25$ mm, probe tip length $t1=12$ mm, height $h=7$ mm, and thickness (not shown)$=2$ mm. The tip network 110 is comprised of a resistive element ("tip resistor") $R_t$ connected between the probe tip 102 and one end of a parallel resistor-capacitor (RC) subnetwork. The other end of the RC subnetwork 240 is connected to the coaxial cable 130 and a ground pin 250. The RC subnetwork 240 consists of a capacitor $C_c$ in parallel with a resistor $R_c$. The housing 200 also contains a ground pin 250 which is connected to the cable shield 260.

The probe tip assembly 101 is designed to minimize stray tip capacitance by placing the tip resistor $R_t$ as close as possible to the circuit being probed, while extending the resistor $R_t$ as far as possible from the ground printed circuit trace of the tip RC subnetwork 240, thereby reducing stray capacitance due to plate effect capacitance between the resistor $R_t$ and probe tip ground. The probe tip 102 is also located as far as practical from the probe tip assembly ground pin 250. Stray capacitance is further reduced by constructing the probe tip assembly housing 200 from non-conductive material, and avoiding the use of ground shielding in the probe tip assembly housing 200. This reduction in stray capacitance is a significant factor in increasing the probe bandwidth.

2. Probe Operation

During operation of the probe, an output signal from the circuit under test 104 is applied via the probe tip 102 to a probe tip network 110. The probe tip network 110 is comprised of a tip resistor $R_t$ having a value of, for example, 500 ohms, in series with a parallel resistor-capacitor (RC) subnetwork 240, the RC (sub)network being well-known in the art. Typical values of the RC subnetwork 240 components are 90K ohms resistance and 3 picofarads capacitance. The resistor $R_c$ in the RC subnetwork 240 provides both signal attenuation and high input resistance at low frequencies. The RC subnetwork capacitor $C_c$ provides a capacitive divider attenuation function at higher frequencies. The embodiment of the invention described herein is a 10X probe; that is, the probe output is a replication of the input signal, with the signal voltage attenuated by a factor of 10.

The major part of the high frequency attenuation is accomplished by the 500 ohm tip resistor $R_t$. At DC and low frequencies, the 90K ohm tip resistor $R_t$ plus a 10K ohm shunt resistor $R_{s3}$ in a terminating network 140 (described later) provide a total of 100.5 K ohm impedance. Due to the AC response of the tip network capacitor $C_c$, the impedance starts to decrease above 1 megahertz, and reaches its minimum value of 500 ohms, attributable to the tip resistor $R_t$, at approximately 100 megahertz.

Figure 4:
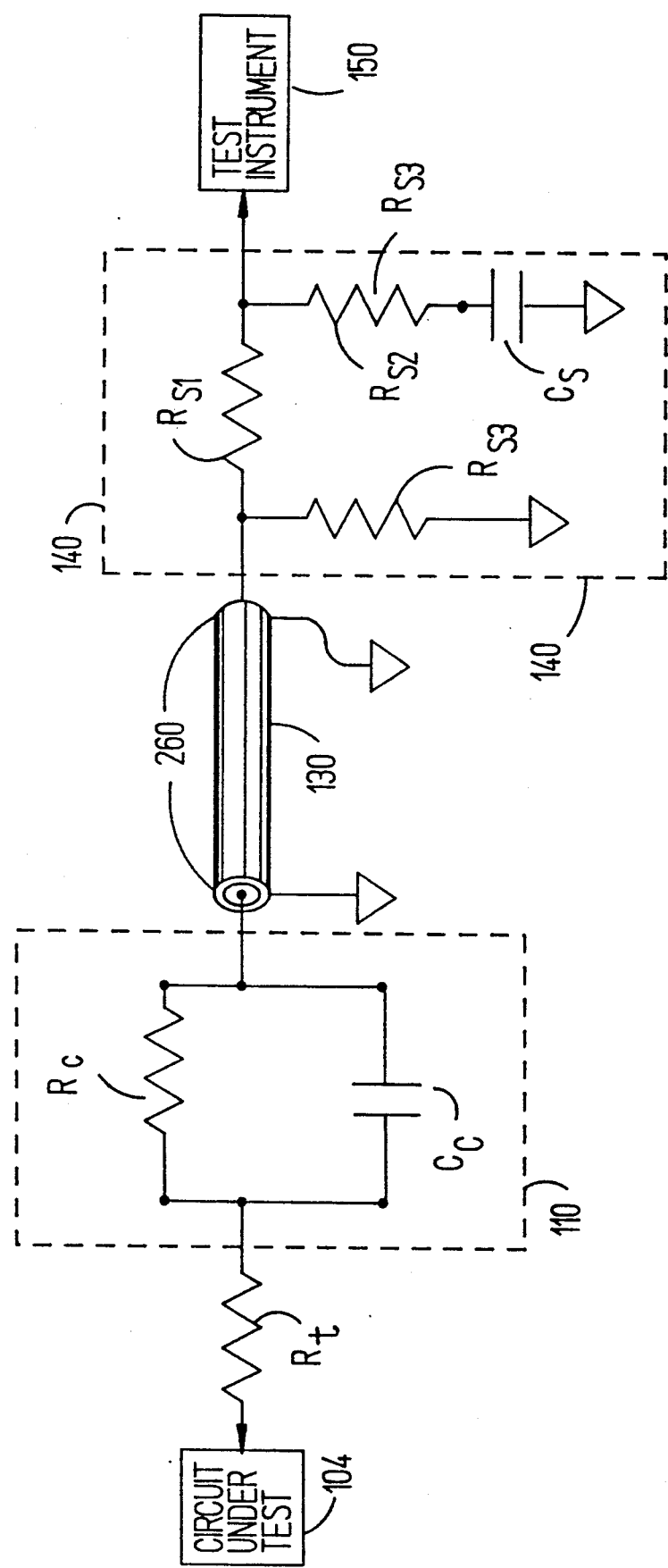
FIG. 4 is a diagram of a complete model of the circuit of the test probe apparatus.

The probe tip network 110 is connected to a coaxial cable 130 having, for example, a 120 ohm impedance. As the risetime of the signal being probed becomes less than the cable delay time, the cable 130 begins to act as a transmission line. FIG. 4 shows a complete model of the circuit of the test probe apparatus, including the terminating network 140. The probe cable 130 is terminated in a network 140 comprising a series resistor $R_{s1}$, both ends of which are shunted to ground. The series resistor $R_{s1}$ end connected to the cable 130 is shunted through resistor $R_{s3}$. The other end of the series resistor $R_{s1}$ is shunted through a resistor $R_{s2}$ and capacitor $C_s$ in series. Typical values are 58 ohms for resistor $R_{s1}$, 10K ohms for resistor $R_{s3}$, 62 ohms for resistor $R_{s2}$, and 15 picofarads for capacitor $C_s$. The terminating network 140 serves several purposes. First, the network terminates the cable 130 for high frequency signals. Secondly the two resistor combination $R_{s1}$, $R_{s2}$ provides additional high frequency attenuation. In addition, by selecting the value of the capacitor $C_s$ to be greater than the cable capacitance, the tip network 110 stabilizes the output node impedance to the point where, after the first reflection, the cable 130 no longer influences the output voltage so as to cause high frequency ringing. Finally, Resistor $R_{s3}$, working with resistor $R_t$, provides DC signal attenuation.

FIG. 3(a) is a graph showing substantial crossover dip as a result of non-optimal probe cable length. After an input square wave or pulsed signal reaches a peak voltage 310, the signal begins to decay exponentially. The signal then dips to a minimum "crossover dip" value 320, at which point a reflected component of the signal belatedly reinforces the signal, causing the signal to rise abruptly before settling to a nominal voltage 340. FIG. 3(b) is a graph showing the time relationship between the primary input signal 350 and a reflected component 360 of the input signal 350 in a probe cable 130 having near-optimal length. The input signal 350 applied to the probe tip 102 is carried by the coaxial cable 130 to the terminating network 140 where a component of the input signal is reflected from the termination 140. This reflected signal component travels back to the signal input node 260 where it is again reflected back from the input node 260 toward the termination network 140. In the probe of the present invention, the cable length is adjusted so that this second signal reflection 360 reinforces the primary input signal 350 during the first waveform transition of the input signal 350 at the point in time where the primary signal falltime amplitude is equal to the input signal voltage $E_{in}$ divided by the desired attenuation factor (here, $E_{in}/10$). With the cable length properly selected, the reflected signal component 360 is summed with the decaying primary input signal 350, to produce a resultant signal 380 starting at time t. The time relationship between the primary input signal 350 and the reflected signal component 360 is such that crossover dip 370 is minimized, and the resultant signal 380 is relatively flat. In the present example, since the desired attenuation factor is 10, the reflected signal 360 should begin to reinforce the primary signal 350 when the primary signal amplitude is $E_{in}/10$. The length of the cable 130 is a function of the required input impedance and required attenuation, and the length of cable 130 which will minimize crossover dip 370 may be approximated by the function:

$$C_{cable} \times \text{length}_{cable} \leq C_c/k$$

where:

$C_{cable}$ = cable capacitance, $\text{length}_{cable}$ = cable length in feet, $C_c$ = capacitance of the RC subnetwork capacitor, and $k = 0.3$, for a 10X probe.

Calculation of probe cable length is described in more detail below.

Figure 5:
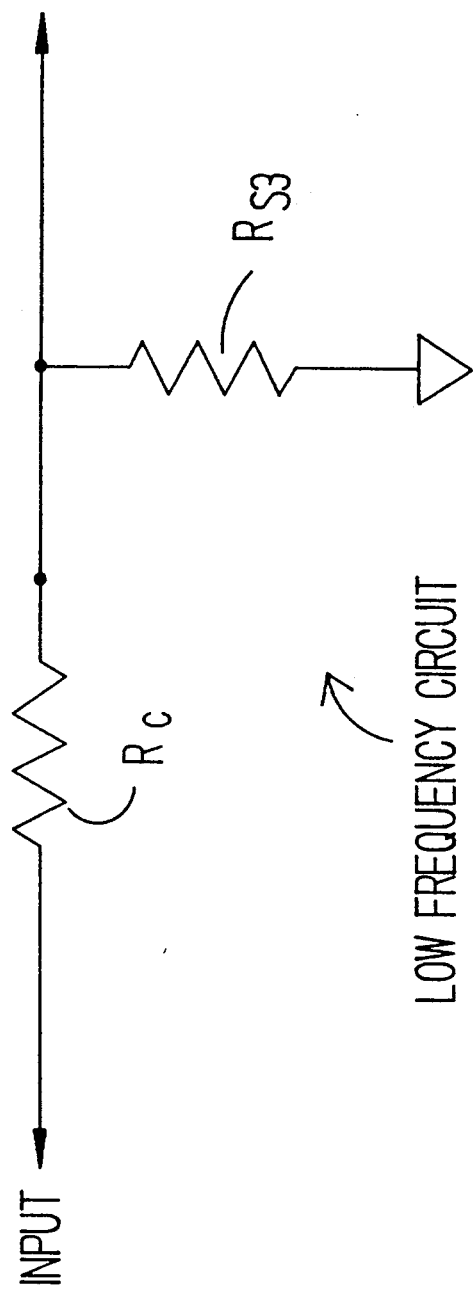
FIG. 5 is a diagram of a DC model of the test probe apparatus.
Figure 6:
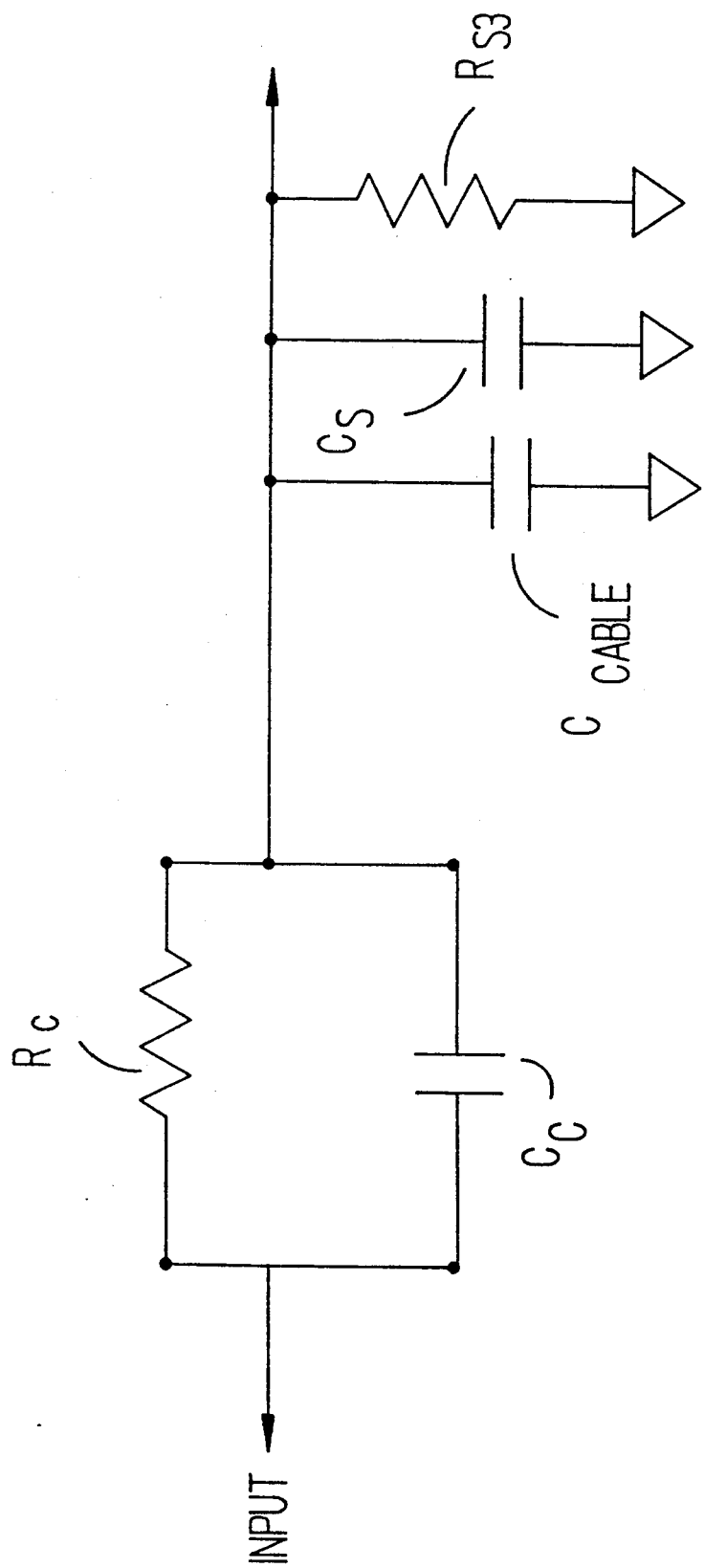
FIG. 6 is a diagram of a mid-band model of the test probe apparatus.
Figure 7:
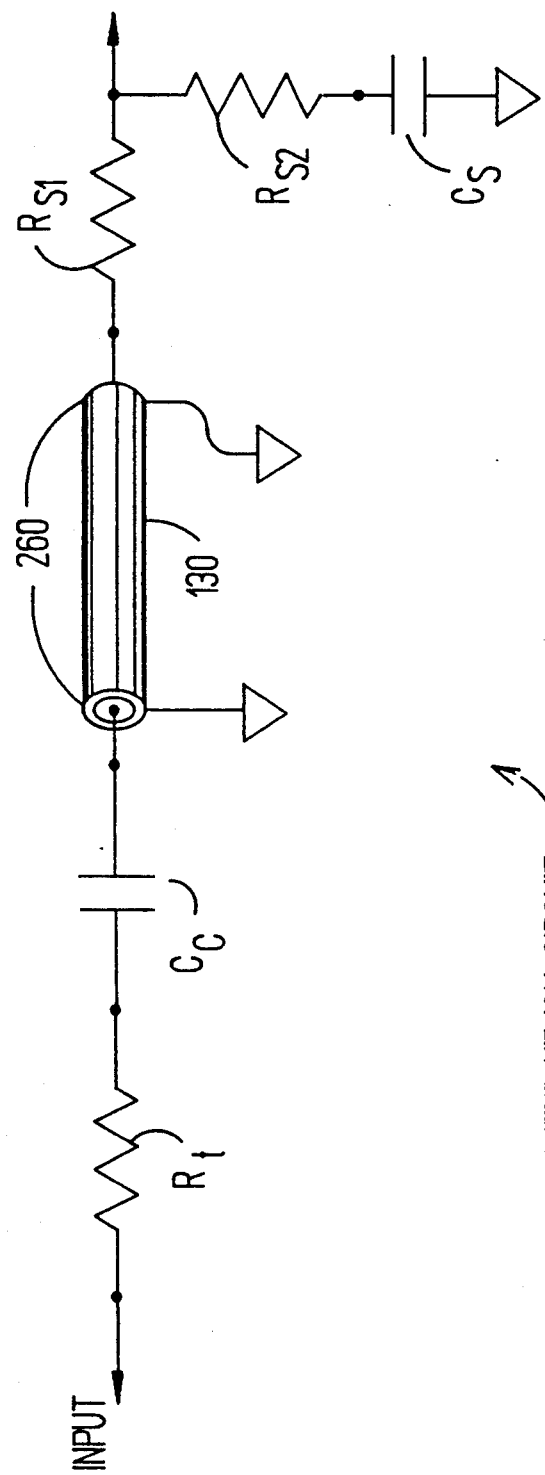
FIG. 7 is a diagram of a high frequency model of the test probe apparatus.

In order to describe the wideband operation of a 10X passive probe, performance of the probe can be categorized into three frequency bands—DC/low frequency (f < 1Mhz), mid-band (1Mhz < f < 100 Mhz), and high-frequency (f < 100 Mhz) [where f = frequency of the signal being probed]. FIG. 4 shows a complete model of the probe circuit of the present invention. FIGS. 5 through 7 each show the probe sub-circuitry which is effective in a given frequency band.

3. DC/Low Frequency Operation

FIG. 5 shows the effective DC/low frequency probe circuit. Given that a minimum DC input resistance of 100K ohms ($\Omega$) is required, The values of tip network resistor $R_c$ and terminating network resistor $R_{s3}$ can be calculated:

$$R_C + R_{S3} = 100\text{K}\Omega \quad (1)$$

$$\text{Gain} = \frac{R_{S3}}{R_C + R_{S3}} = 0.1 \quad (2)$$

Therefore:

$$R_c = 90\text{K}\Omega \text{ and } R_{s3} = 10\text{K}\Omega \quad (3)$$

4. Mid-Band Operation

FIG. 6 shows the effective probe circuit at mid-band frequencies. Given a 10" length of standard 120 ohm coaxial cable 130, the typical cable capacitance is approximately 9 picofarads (pF) The terminating network capacitor $C_s$ value should be substantially greater than the cable capacitance, for example, 15 picofarads. At midband frequencies the probe apparatus 100 assumes the characteristics of a frequency compensated capacitive divider circuit. The value of tip network capacitor $C_c$ can now be calculated:

$$R_c C_c = (C_{cable} + C_s) R_{s3} \quad (1)$$

$$90\text{K}\Omega C_c = (9\text{pF} + 15 \text{ pF})(10\text{K}\Omega) \quad (2)$$

$$C_C = \frac{(24 \text{ Pf})(10\text{K}\Omega)}{90\text{K}\Omega} \quad (3)$$

$$C_c = 2.67 \text{ pF} \quad (4)$$

Allowing for an additional 10% midband gain:

$$C_c = 2.67 \text{ pF} \times 1.1 \approx 3 \text{ pF} \quad (5)$$

5. High Frequency Operation

FIG. 7 shows the effective probe circuit at high frequencies. For purposes of example, a probe with an attenuation factor of 10X has been selected, which corresponds to a gain of 0.1. The characteristic impedance, $Z_0$, of the selected probe cable 130 is 120 ohms, but cables having other impedances such as 50 ohms or 100 ohms may also be used and still provide the advantages of the present invention. A tip resistor $R_t$ value of 500 ohms has been chosen for the described embodiment, but this value can be increased or decreased and the resulting probe still falls within the scope of the present invention, within the limits of the corresponding parameters. The following parameters are thus given:

$$\text{Gain} = 0.1 \quad (1)$$

$$Z_0 = 120\Omega \quad (2)$$

$$R_t = 500\Omega \quad (3)$$

Values for $R_{s1}$ and $R_{s2}$ can now be calculated:

$$R_{S1} + R_{S2} = Z_0 \quad (4)$$

$$\text{GAIN}_{HF} = \frac{R_{S2}}{R_t + R_{S1} + R_{S2}} = 0.1 \quad (5)$$

Solving equations (4) and (5) produces:

$$R_{s1} \approx 58\Omega \text{ and} \quad (6)$$

$$R_{s2} \approx 62\Omega \quad (7)$$

6. Cable Length Determination

First of all, it is assumed that the cable 130 should have an AC line termination in order to maintain high DC input resistance. In addition, a value for the termination network capacitor $C_s$ is selected which is approximately 2 times that of the cable capacitance. This value is chosen to stabilize the output node from significant transmission line effects after one wavefront transition.

A fast rise time square wave signal applied to the probe cable 130 can be represented by the equation:

$$\frac{Z_0}{Z_0 + R_t} E_{in} e^{-\frac{t}{(Z_0 + R_t)(C_C)}} \quad (1)$$

where:
$E_{in}$ = input signal voltage
P $Z_0$ = cable characteristic impedance = 120Ω,
$R_t$ = tip resistor resistance = 500Ω,
$C_c$ = tip network capacitance = 3pF, and
t = elapsed time Substituting the known values into (1) yields:

$$0.19 E_{in} e^{-\frac{t}{(18.6 \times 10^{-9})}} \quad (2)$$

The equation for the voltage at the end of the cable 130 terminated with 120 ohms and 15 picofarads is:

$$0.19 E_{in} [e^{-\frac{t}{(1.86 \times 10^{-9})}}][2 - e^{-\frac{t}{(Z_0 + RS1 + RS2)(C_C)}}] \quad (3)$$

Solving the equation for t, where $E_{in} < 0.1$ (for 10X attenuation) yields:

$$t = 1.8 \text{ns (nanoseconds)} \quad (4)$$

This is the point in time where the reflected signal must reinforce the decaying amplitude of the original signal in order to minimize the crossover dip. Since the signal must travel two cable lengths in time t (from the input end of the cable 130 to the output end, and back to the input end), the cable length required is that which will delay the signal by one half of this two-way transit time. Therefore:

$$t_{one-way} = t/2 = 0.9 \text{ ns} \quad (5)$$

Given a signal propagation velocity through the cable 130 = 0.09 ns/inch, the cable length required to minimize the crossover dip equals:

$$\frac{0.9 \text{ ns}}{0.09 \text{ ns/inch}} = 10 \text{ inches} \quad (6)$$

The general equation for the length of coaxial cable 130 required to minimize crossover dip is:

$$G = \frac{Z_0}{Z_0 + R_t} E_{in} [e^{-\frac{2vl}{(Z_0 + R_t)(C_C)}}][2 - e^{-\frac{2vl}{(Z_0 + RS1 + RS2)(C_C)}}]$$

where:
G = probe apparatus 100 gain (1/probe attenuation),
v = signal propagation velocity through the cable 130 in nanoseconds per unit length, and
l = length of the cable 130 in units.

Figure 8:
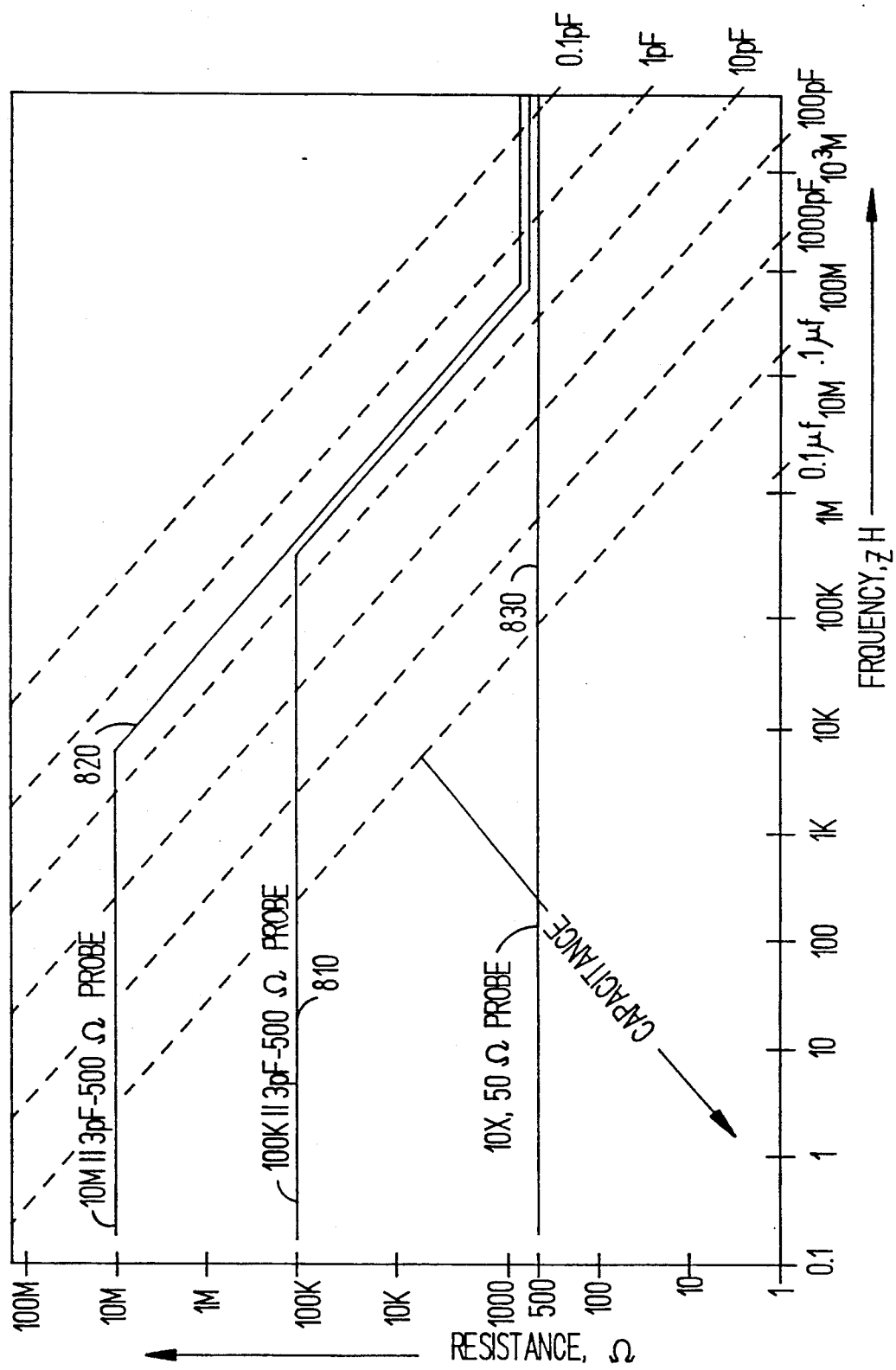
FIG. 8 is a graph showing probe impedance versus signal frequency for two versions of the probe of the present invention and a prior art standard coaxial cable probe.

FIG. 8 is a graph showing probe impedance versus signal frequency for two versions 810, 820 of the probe of the present invention and a prior art standard coaxial cable probe 830. Version 810 is the embodiment of the probe described in the examples above, the version 810 having the series resistance of low-frequency-effective resistors $R_c$ and $R_{s3}$ equal to 100K ohms, and a tip subnetwork RC capacitance $C_c$ of 3 pF. Version 820 is an embodiment of the present invention having a series resistance of low-frequency-effective resistors $R_c$ and $R_{s3}$ equal to 10M ohms, and a tip subnetwork RC capacitance $C_c$ of 3 pF. It can be observed that both the prior art 50 ohm probe 830 and both depicted embodiments 810, 820 of the present invention maintain high input impedance (500 ohms) at high frequencies. However, the 50 ohm probe 830 shown in the graph exhibits much lower impedance at low frequencies than probes designed in accordance with the present invention. Prior art probes can be designed to have higher impedance at lower frequencies (than the shown probe 830) but with a corresponding reduction in their impedance at higher frequencies. The probe apparatus of the present invention combines the more favorable aspects of the prior art with respect to high impedance across a wide bandwidth, while using standard coaxial cable.

It is to be expressly understood that the claimed invention is not to be limited to the description of the preferred embodiment but encompasses other modifications and alterations within the scope and spirit of the inventive concept.

I claim:

1. Passive test probe apparatus comprising:
    means for receiving an input signal from a circuit under test, said receiving means including a probe tip connectable to said circuit under test, a resistive element and an RC subnetwork, said RC subnetwork having a first end and second end, said resistive element being connected between said first end of said RC subnetwork and said probe tip, said RC subnetwork including a resistor $R_c$ and a capacitor $C_c$ connected in parallel;

a low loss coaxial cable, said cable having a first end and a second end, said first end of said cable connected to said second end of said RC subnetwork, said cable having a length which is determined by a required probe input impedance and a required attenuation, so as to minimize crossover dip, and means, connected to said second end of said coaxial cable, for terminating said input signal in approximately the characteristic impedance of said coaxial cable.

2. The apparatus of claim 1, wherein said resistive element has a resistance at least as great as a required minimum input resistance of said test probe apparatus.

3. The apparatus of claim 1, wherein said receiving means further includes:

a non-conductive housing having a main section and a tip section, said main section having a front end, a top, and a bottom, said tip section protruding outward from said front end of said main section of said top thereof, said main section of said housing containing said resistive element and said RC subnetwork, said resistive element being located in close physical relation to said front end and said top of said main section of said housing, said second end of said RC subnetwork being connected to a ground pin, said ground pin being located in abutting relation to said bottom of said housing, said probe tip being located entirely within said tip section of said housing.

4. The apparatus of claim 1, wherein said coaxial cable has a length such that crossover dip is minimized, said crossover dip being the result of a sum of said input signal and a component of said input signal, said component being reflected a first time, from said second end of said coaxial cable, and then reflected a second time, from said first end of said coaxial cable, during the first waveform transition of said input signal, said crossover dip being minimized by selecting said length of said coaxial cable so that said second time reflected component of said input signal reinforces said input signal at a point in time where the input signal falltime amplitude is equal to the voltage of said input signal divided by said required attenuation.

5. The apparatus of claim 1, wherein said required attenuation is equal to said voltage of said input signal divided by 10, and said coaxial cable has a length determined by the function: $C_{cable} \times length_{cable} \leq C_c/k$, here $C_{cable}$ equals cable capacitance per unit length, $length_{cable}$ equals said length of said cable in said units, $C_c$ equals the capacitance of said RC subnetwork capacitor, and k is a factor determined by the characteristic impedance of said cable and said required attenuation.

6. The apparatus of claim 1, wherein said required attenuation is equal to said voltage of said input signal divided by 10, and said coaxial cable has a length determined by a function wherein said length of said cable in units is approximately equal to the capacitance of said capacitor $C_c$ in said RC subnetwork divided by the product of 0.3 and the capacitance of said cable per said unit of length.

7. The apparatus of claim 1, wherein said probe apparatus is terminated in a resistance having a value $R_{s1}+R_{s2}$ shunted to ground, and said coaxial cable has a length determined by the equation:

$$G = \frac{Z_0}{Z_0 + R_t} E_{in} [e^{-\frac{2vl}{(Z_0+R_t)(CC_c)}}[2 - e^{-\frac{2vl}{(Z_0+R_{S1}+R_{S2})(C_c)}}]$$

where G equals the gain of said probe apparatus, $E_{in}$ equals the voltage of said input signals, e is the natural logarithm base value, $Z_0$ equals the characteristic impedance of said cable, $R_t$ equals the resistance of said resistive element in said receiving means, $C_c$ equals the capacitance of said capacitor $C_c$ in said RC subnetwork, v equals the signal propagation velocity through said cable in nanoseconds per unit length, and l equals said length of said cable n said units.

8. The apparatus of claim 1, wherein said terminating means includes:

two resistors $R_{s1}$, $R_{s2}$ connected in series, said two resistors also connected in series with a capacitor $C_s$ having a value substantially greater than the value of the capacitance of said coaxial cable.

9. Passive test probe apparatus, said apparatus having a given attenuation comprising:

probe tip network means for receiving an input signal from a circuit under test;

a low-loss coaxial cable having a first end and a second end, said first end being connected to said probe tip network means, said coaxial cable having a length such that crossover dip is minimized, said crossover dip being the result of a sum of said input signal and a component of said input signal, said component being reflected a first time, from said second end of said coaxial cable, and then reflected a second time, from said first end of said coaxial cable, during the first waveform transition of said input signals, said crossover dip being minimized by selecting said length of said coaxial cable so that said second time reflected component of said input signal reinforces said input signal at a point in time where the input signal falltime amplitude is equal to a voltage of said input signal divided by said given attenuation of said probe apparatus; and means, connected to said second end of said coaxial cable, for terminating said input signal in approximately the characteristic impedance of said coaxial cable.

10. The apparatus of claim 9, wherein said given attenuation is equal to said voltage of said input signal divided by 10, and said coaxial cable has a length determined by the function:

$$C_{cable} \times length_{cable} \leq C_c/k,$$

where $C_{cable}$ equals cable capacitance per unit length, $length_{cable}$ equals said length of said cable in said units, $C_c$ equals the capacitance of said RC subnetwork capacitor, and k is a factor determined by the characteristic impedance of said cable and said given attenuation.

11. The apparatus of claim 9, wherein said given attenuation is equal to said voltage of said input signal divided by 10, and said coaxial cable has a length determined by a function wherein said length of said cable in units is approximately equal to the capacitance of said capacitor $C_c$ in said RC subnetwork divided by the product of 0.3 and the capacitance of said cable per said unit of length.

12. The apparatus of claim 9, wherein said probe apparatus is terminated in a resistance having a value $R_{s1} \times R_{s2}$ shunted to ground, and said coaxial cable has a length determined by the equation:

$$G = \frac{Z_0}{Z_0 + R_t} E_{in} [e^{-\frac{2vl}{(Z_0+R_t)(C_C)}}[2 - e^{-\frac{2vl}{(Z_0+R_{S1}+R_{S2})(C_S)}}]$$

wherein G equals the gain of said probe apparatus, $E_{in}$ equals the voltage of said input signal, e is the natural logarithm base value, $Z_0$ equals the characteristic impedance of said cable, $R_t$ equals the resistance of said resistive element in said receiving means, $C_c$ equals the capacitance of said capacitor $C_c$ in said RC subnetwork, v equals the signal propagation velocity through said cable in nanoseconds per unit length, and l equals said length of said cable in said units.

13. Passive test probe apparatus for receiving an input signal from a circuit under test, said input signal having a signal voltage, said apparatus having a given attenuation, said apparatus comprising:
 a probe tip assembly including a probe tip and a tip network, said tip network including a first resistive element, a RC subnetwork having an input and an output, and a non-conductive probe tip assembly housing, said first resistive element being connected between said input of said RC subnetwork and said probe tip;
 a low-loss coaxial cable having a first end and a second end, said first end connected to said output of said RC subnetwork, said coaxial cable having a length such that crossover dip is minimized, said crossover dip being the result of a sum of said input signal and a component of said input signal, said component being reflected during the first waveform transition of said input signal; and
 a terminating network connected to said second end of said coaxial cable, said terminating network including two resistors $R_{s1}$, $R_{s2}$ connected in series, said two resistors also connected in series with a capacitor $C_s$ having a value substantially greater than the value of the capacitance of said coaxial cable.

14. The apparatus of claim 13 wherein said RC subnetwork includes a capacitive element and a second resistive element in parallel, said first resistive element being connected in series with said capacitive element and second resistive element, said resistance of said first resistive element having a resistance at least as great as a required minimum input resistance of said test probe apparatus, said resistance providing a high frequency attenuation minimum value.

15. The apparatus of claim 13, wherein said given attenuation is equal to said signal voltage of said input signal divided by 10, and said coaxial cable has a length determined by the function:

$$C_{cable} \times length_{cable} \leq C_c/k,$$

wherein $C_{cable}$ equals cable capacitance per unit length, $length_{cable}$ equals said length of said cable in said units, $C_c$ equals the capacitance of said RC subnetwork capacitor, and k is a factor determined by the characteristic impedance of said cable and said given attenuation.

16. The apparatus of claim 13, wherein said given attenuation is equal to said signal voltage of said input signal divided by 10, and said coaxial cable has a length determined by a function wherein said length of said cable in units is approximately equal to the capacitance of said capacitor $C_c$ in said RC subnetwork divided by the product of 0.3 and the capacitance of said cable per said unit of length.

17. The apparatus of claim 13, wherein said probe apparatus is terminated in a resistance having a value $R_{s1} \times R_{s2}$ shunted to ground, and said coaxial cable has a length determined by the equation:

$$G = \frac{Z_0}{Z_0 + R_t} E_{in} [e^{-\frac{2vl}{(Z_0+R_t)(C_C)}}[2 - e^{-\frac{2vl}{(Z_0+R_{S1}+R_{S2})(C_S)}}]$$

where G equals the gain of said probe apparatus, $E_{in}$ equals the voltage of said input signal, e is the natural logarithm base value, $Z_0$ equals the characteristic impedance of said cable, $R_t$ equals the resistance of said resistive element in said receiving means, $C_c$ equals the capacitance of said capacitor $C_c$ in said RC subnetwork, v equals the signal propagation velocity through said cable in nanoseconds per unit length, and l equals said length of said cable in said units.

18. Passive test probe apparatus comprising:
 a probe tip assembly including a probe tip and a probe tip network, said probe tip network including a first resistive element connected to an RC subnetwork, said probe tip network being contained in a non-conductive housing, said housing having a main section and a tip section, said main section having a front end, a top, and a bottom, said tip section protruding outward from said front end of said main section at said top thereof, said main section of said housing containing said resistive element and said RC subnetwork, said resistive element being located in close physical relation to said front end and said top of said main section of said housing, said second end of said RC subnetwork being connected to a ground pin, said ground pin being located in abutting relation to said bottom of said housing, said probe tip being located entirely within said tip section of said housing;
 a low-loss coaxial cable having a first end and a second end, said first end connected to said probe tip assembly; and
 a terminating network connected to said second end of said coaxial cable, wherein said terminating network terminates said coaxial cable in its characteristic impedance.

19. The apparatus of claim 18 wherein said RC subnetwork includes a capacitive element and a second resistive element in parallel, said first resistive element being connected in series with said capacitive element and second resistive element, said resistance of said first resistive element having a resistance at least as great as a required minimum input resistance of said test probe apparatus, said resistance providing a high frequency attenuation minimum value.

20. Passive test probe apparatus comprising:
 a tip network;
 a terminating network; and
 a coaxial cable connected between said tip network and said terminating network, wherein said probe apparatus is terminated in a resistance having a value $R_{s1} \times R_{s2}$ shunted to ground, and said coaxial cable has a length determined by the equation:

$$G = \frac{Z_0}{Z_0 + R_t} E_{in} [e^{-\frac{2vl}{(Z_0+R_t)(C_C)}}[2 - e^{-\frac{2vl}{(Z_0+R_{S1}+R_{S2})(C_S)}}]$$

where G equals the gain of said probe apparatus, $E_{in}$ equals the voltage of said input signal, e is the natural logarithm base value, $Z_0$ equals the characteristic impedance of said cable, $R_t$ equals the resistance of said resistive element in said receiving means, $C_c$ equals the capacitance of said capacitor $C_c$ is said RC subnetwork, v equals the signal propagation velocity through said cable in nanoseconds per unit length, and 1 equals said length of said cable in said units.

21. A method for probing a signal in a circuit under test comprising the steps of:

receiving said signal from said circuit under test in a probe tip assembly that includes a probe tip connectable to said circuit under test, a resistive element and an RC subnetwork, said RC subnetwork having a first end and a second end, said resistive element being connected between said first end of said RC subnetwork and said probe tip, said RC subnetwork including a resistor $R_c$ and a capacitor $C_c$ connected in parallel;

transmitting said signal through a length of low loss coaxial cable, said cable having a first end and a second end, said cable having a length such that crossover dip is minimized, said crossover dip being the result of a sum of said signal and a component of said signal, said component being reflected a first time, from said second end of said coaxial cable, and then reflected a second time, from said first end of said coaxial cable, during the first waveform transition of said signal, said crossover dip being minimized by selecting said length of said coaxial cable so that said second time reflected component of said signal reinforces said signal at a point in time where the signal falltime amplitude is equal to a voltage of said input signal divided by a required attenuation value; and terminating said signal in approximately the characteristic impedance of said cable at said second end.

22. The method of claim 21, including the additional step of terminating said signal a said second end.

23. The method of claim 21, wherein said signal which as been transmitted through said coaxial cable is output to a test instrument.

* * * * *

UNITED STATES PATENT AND TRADEMARK OFFICE
CERTIFICATE OF CORRECTION

PATENT NO. : 5,172,051
DATED : Dec. 15, 1992
INVENTOR(S) : Thomas J. Zamborelli

It is certified that error appears in the above-indentified patent and that said Letters Patent is hereby corrected as shown below:

Col. 9, l. 23 -- after "section" delete "of" and insert therefor --at--

Col. 9, l. 51 -- delete "here" and insert therefor --where--

Col. 10, l. 1 -- delete

"$G = \frac{Z_0}{Z_0+R_1} E_{in} [e^{-2vl/(Z_0+Rt)(Cc)}] [2-e^{-2vl/(Z_0+Rs1+Rs2)(Cc)}]$"

and insert therefor $$G = \frac{Z_0}{Z_0+R_t} E_{in} \left[ e^{-\frac{2vl}{(Z_0+R_t)(C_c)}} \right] \left[ 2 - e^{-\frac{2vl}{(Z_0+R_{S1}+R_{S2})(C_S)}} \right]$$

Col. 10, l. 14 -- after "cable" delete "n" and insert therefor --in--

Col. 10, l. 36 -- delete "signals" and insert therefor --signal--

Col. 11, l. 1 -- delete "$R_{s1} \times R_{s2}$" and insert therefor --$R_{s1} + R_{s2}$--

Col. 11, l. 5 -- delete

"$G = \frac{Z_0}{Z_0+R_1} E_{in} [e^{-2vl/(Zo+Rt)(Cc)}] [2-e^{-2vl/(Zo+Rs1+Rs2)(Cc)}]$"

and insert therefor $$G = \frac{Z_0}{Z_0+R_t} E_{in} \left[ e^{-\frac{2vl}{(Z_0+R_t)(C_c)}} \right] \left[ 2 - e^{-\frac{2vl}{(Z_0+R_{S1}+R_{S2})(C_S)}} \right]$$

UNITED STATES PATENT AND TRADEMARK OFFICE
CERTIFICATE OF CORRECTION

PATENT NO. : 5,172,051
DATED : Dec. 15, 1992
INVENTOR(S) : Thomas J. Zamborelli

It is certified that error appears in the above-indentified patent and that said Letters Patent is hereby corrected as shown below:

Col. 12, l. 5 -- delete "$R_{s1}$ X Rs2" and insert therefor --$R_{s1}$ + $R_{s2}$--

Col. 12, l. 9 -- delete

"$G = \frac{Z_O}{Z_o+R_l} E_{in}[e^{-2vl/(Zo+Rt)(Cc)}][2-e^{-2vl/(Zo+Rs1+Rs2)(Cc)}]$"

and insert therefor $$G = \frac{Z_0}{Z_0+R_t} E_{in} \left[ e^{-\frac{2vl}{(Z_0+R_t)(C_c)}} \right] \left[ 2-e^{-\frac{2vl}{(Z_0+R_{s1}+R_{s2})(C_s)}} \right]$$

Col. 12, l. 63 -- delete "$R_{s1}$ X $R_{s2}$" and insert therefor --$R_{s1}$ + $R_{s2}$--

Col. 12, l. 66 -- delete

"$G = \frac{Z_O}{Z_o+R_l} E_{in}[e^{-2vl/(Zo+Rt)(Cc)}][2-e^{-2vl/(Zo+Rs1+Rs2)(Cc)}]$"

and insert therefor $$G = \frac{Z_0}{Z_0+R_t} E_{in} \left[ e^{-\frac{2vl}{(Z_0+R_t)(C_c)}} \right] \left[ 2-e^{-\frac{2vl}{(Z_0+R_{s1}+R_{s2})(C_s)}} \right]$$

Col. 13, l. 7 -- delete "is" and insert therefor --in--

UNITED STATES PATENT AND TRADEMARK OFFICE
CERTIFICATE OF CORRECTION

PATENT NO. : 5,172,051
DATED : Dec. 15, 1992
INVENTOR(S) : Thomas J. Zamborelli

It is certified that error appears in the above-indentified patent and that said Letters Patent is hereby corrected as shown below:

Col. 14, l. 19 -- after "signal" delete "a" and insert therefor --at--

Signed and Sealed this

Second Day of January, 1996

Attest:

BRUCE LEHMAN

Attesting Officer

Commissioner of Patents and Trademarks